United States Patent
Maki et al.

(10) Patent No.: US 6,677,758 B2
(45) Date of Patent: Jan. 13, 2004

(54) MULTIPLEX VOLTAGE MEASUREMENT APPARATUS

(75) Inventors: Ichiro Maki, Kanagawa (JP); Hirofumi Yudahira, Hamana-gun (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 10/402,126

(22) Filed: Mar. 28, 2003

(65) Prior Publication Data

US 2003/0189419 A1 Oct. 9, 2003

Related U.S. Application Data

(63) Continuation of application No. 09/829,762, filed on Apr. 10, 2001, now Pat. No. 6,570,387.

(30) Foreign Application Priority Data

Apr. 10, 2000 (JP) ........................................ 2000-108672

(51) Int. Cl.[7] ............................................ G01N 27/416
(52) U.S. Cl. ....................................................... 324/429
(58) Field of Search ................................. 324/429–434

(56) References Cited

U.S. PATENT DOCUMENTS

| | | | |
|---|---|---|---|
| 5,808,469 A | 9/1998 | Kopera | ........................ 324/434 |
| 5,914,606 A | 6/1999 | Becker-Irvin | ................ 324/434 |
| 6,362,627 B1 | 3/2002 | Shimamoto et al. | ........ 324/434 |
| 6,570,387 B2 * | 5/2003 | Maki et al. | .................. 324/434 |

FOREIGN PATENT DOCUMENTS

| | | |
|---|---|---|
| JP | 08140204 | 5/1996 |
| WO | WO99/45402 | 10/1999 |

* cited by examiner

*Primary Examiner*—Pia Tibbits
(74) *Attorney, Agent, or Firm*—Snell & Wilmer, LLP

(57) ABSTRACT

A multiplex voltage measurement apparatus includes: (N+1) voltage detection terminals connected to N serially connected voltage sources; a capacitor which is charged with a voltage value of any of the N voltage sources; a first sample switch for selectively connecting odd-numbered voltage detection terminals among the (N+1) voltage detection terminals to a first terminal of the capacitor; a second sample switch for selectively connecting even-numbered voltage detection terminals among the (N+1) voltage detection terminals to a second terminal of the capacitor; a voltage measurement circuit for measuring the voltage value stored in the capacitor; a third sample switch for connecting the first terminal and the second terminal of the capacitor to the voltage measurement circuit; and a polarity controller for controlling the first and second sample switches such that one of the N voltage sources is selected while the third sample switch is open.

2 Claims, 4 Drawing Sheets

MULTIPLEX VOLTAGE MEASUREMENT APPARATUS

This application is a Continuation of U.S. application Ser. No. 09/829,762 filed Apr. 10, 2001 now U.S. Pat. No. 6,570,387.

BACKGROUND OF THE INVENTION

1. Field of the Invention

The present invention relates to a multiplex voltage measurement apparatus, and specifically to a multiplex voltage measurement apparatus for measuring a voltage of each of serially connected N voltage sources.

2. Description of the Related Art

A high-power electric source of several hundred voltages for an electric vehicle is formed by a number of secondary battery cells, such as nickel-hydrogen storage cells, which are serially connected to each other. Each of the serially connected battery cells should be monitored for its capacity for the purpose of charge/discharge control.

In particular, a battery formed by 240 serially connected cells produces a total voltage of 288 V. In such a battery, it is physically difficult to monitor each cell. In Japanese Laid-Open Publication No. 8-140204, for example, the voltage is measured for each of 24 modules each including 10 cells.

In an electric vehicle, high-voltage systems are electrically insulated from a chassis in order to avoid hazardous conditions. On the other hand, since a processor for charge/discharge control uses a potential of the chassis as a reference potential, the voltage of a battery should be insulatively measured.

In the battery disclosed in Japanese Laid-Open Publication No. 8-140204, an insulation circuit unit including an operational amplifier, an AD converter, a photocoupler, a power supply, etc., is provided for each module. The structure of such a battery is enormously complicated.

As means of insulatively measuring the output voltage of a sensor or the like, a flying capacitor is known. FIG. 3 shows a structure of a multiplex voltage measurement apparatus 300. In this example, the number of voltage sources (N) is 5.

Serially-connected voltage sources V1–V5 are connected to a capacitor 3 through voltage detection terminals T1–T6, and through a first sample switch 1 formed by switches S1, S3, and S5 and a second sample switch 2 formed by switches S2, S4, and S6. The capacitor 3 is connected to a voltage measurement circuit 5 through a third sample switch 4 formed by switches 4a and 4b.

FIG. 4 is a timing chart for opening/closure of the respective switches S1–S6, and 4a and 4b. An operation of the multiplex voltage measurement apparatus 300 is now described with reference to FIG. 4 in conjunction with FIG. 3.

Prior to measuring the voltages of the voltage sources V1–V5, the switches S1–S6, and 4a and 4b are all opened (OFF). During period P1, first of all, the switches S1 and S2 are closed (ON), whereby the voltage of the voltage source V1 is applied to the capacitor 3, and a charge is stored in the capacitor 3. After being kept closed (ON) for a predetermined time period, the switches S1 and S2 are turned off. Then, after a predetermined time has elapsed since the switches S1 and S2 were turned off, the third sample switch 4 (switches 4a and 4b) is turned on, whereby the charged voltage in the capacitor 3, i.e., the voltage of the voltage source V1, is transferred to the voltage measurement circuit 5.

As a matter of course, a driving circuit of each switch and a contact point of the switch are kept separated. The first sample switch 1 is not closed while the third sample switch 4 is closed, and the second sample switch 2 is not closed while the third sample switch 4 is closed. Therefore, the voltage of the voltage source V1 is insulatively measured, i.e., when the voltage of the voltage source V1 is measured, the voltage source V1 and the capacitor 3 are insulated.

During period P2, the switches S2 and S3 and the switches 4a and 4b are similarly turned on and off, and during period P3, the switches S3 and S4 and the switches 4a and 4b are similarly turned on and off. In this way, as shown in FIG. 4, the multiplex voltage measurement apparatus 300 operates in a multiplex manner to measure the voltage values of the voltage sources V1–V5.

In the above structure of the conventional voltage measurement apparatus, when measuring the voltage source V1 after the voltage source V5 has been measured, the switches S1 and S2 are closed (ON). However, if one of the switches S1 and S2 is out of order, e.g., one of the switches S1 and S2 which should be closed is left opened, the voltage of the voltage source V1 cannot be stored in the capacitor 3, and the charge in the capacitor 3 which was stored when the voltage source V5 was measured remains in the capacitor 3. Since the polarity of the capacitor 3 when the voltage of the voltage source V1 is measured is the same as that when the voltage of the voltage source V5 is measured, the voltage measurement apparatus 300 erroneously reads the voltage of the voltage source V5.

Thus, when one of the switches S1 and S2 is out of order so that it cannot be closed, the previously stored charge is left in the capacitor 3. Therefore, the voltage measurement apparatus 300 erroneously reads the voltage left in the capacitor 3, and cannot detect the failure which may cause such an erroneous measurement.

SUMMARY OF THE INVENTION

According to one aspect of the present invention, a multiplex voltage measurement apparatus includes: (N+1) voltage detection terminals connected to N serially connected voltage sources; a capacitor which is charged with a voltage value of any of the N voltage sources; a first sample switch for selectively connecting odd-numbered voltage detection terminals among the (N+1) voltage detection terminals to a first terminal of the capacitor; a second sample switch for selectively connecting even-numbered voltage detection terminals among the (N+1) voltage detection terminals to a second terminal of the capacitor; a voltage measurement circuit for measuring the voltage value stored in the capacitor; a third sample switch for connecting the first terminal and the second terminal of the capacitor to the voltage measurement circuit; and a polarity controller for controlling the first and second sample switches such that one of the N voltage sources is selected while the third sample switch is open.

In one embodiment of the present invention, the polarity controller allows the first and second sample switches to sequentially select among the N voltage sources in a one-by-one manner such that the capacitor is alternately charged with voltage values having opposite polarities.

According to the present invention, when the voltages of voltage sources are sequentially measured, voltages having opposite polarities, i.e., positive voltages and negative voltages, are alternately applied to a capacitor. With such an arrangement, even when a first sample switch or a second sample switch is out of order so that it cannot be closed, and the voltage measured at a previous measurement remains in the capacitor, the voltage measurement apparatus can determine that there is a broken switch because a voltage measurement apparatus obtains voltage values of the same polarity in succession.

Thus, the present invention is characterized in that a voltage measurement apparatus includes a polarity controller for allowing the sample switches to sequentially select the voltage sources such that voltages having opposite polarities are alternately stored in the capacitor.

Thus, the invention described herein makes possible the advantages of (1) providing a multiplex voltage measurement apparatus which does not measure an erroneous voltage even when one of sample switches is out of order so that it cannot be closed; and (2) providing a multiplex voltage measurement apparatus which can detect a failure in an operation of one of the sample switches.

These and other advantages of the present invention will become apparent to those skilled in the art upon reading and understanding the following detailed description with reference to the accompanying figures.

DESCRIPTION OF THE PREFERRED EMBODIMENTS

Hereinafter, a multiplex voltage measurement apparatus 100 according to one embodiment of the present invention is described with reference to FIG. 1.

Figure 1:
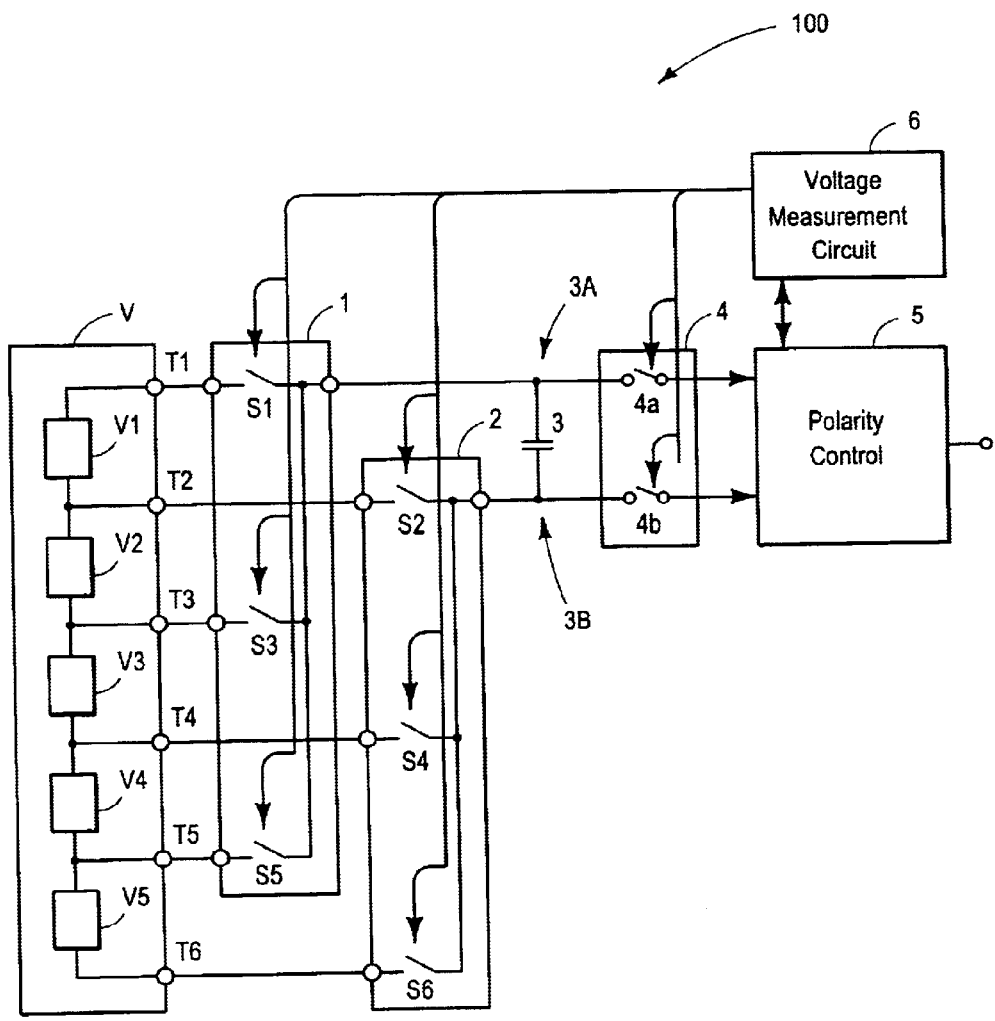
FIG. 1 shows a structure of a multiplex voltage measurement apparatus 100 according to one embodiment of the present invention.
Figure 3:
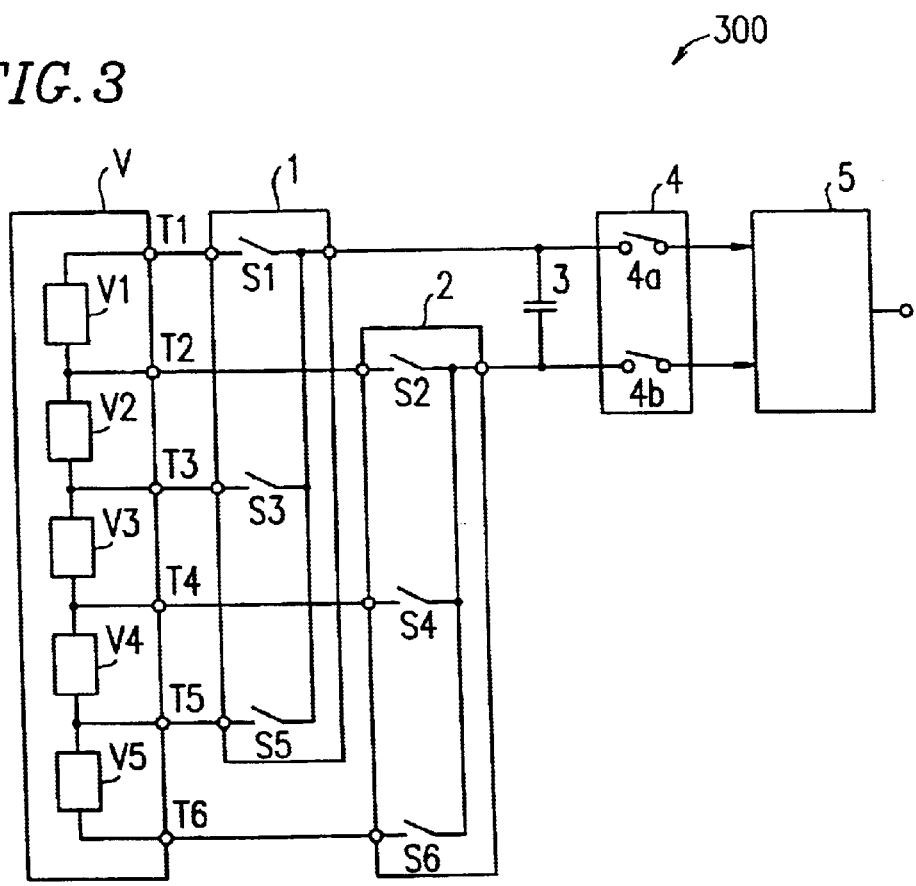
FIG. 3 shows a structure of a conventional multiplex voltage measurement apparatus 300.
Figure 4:
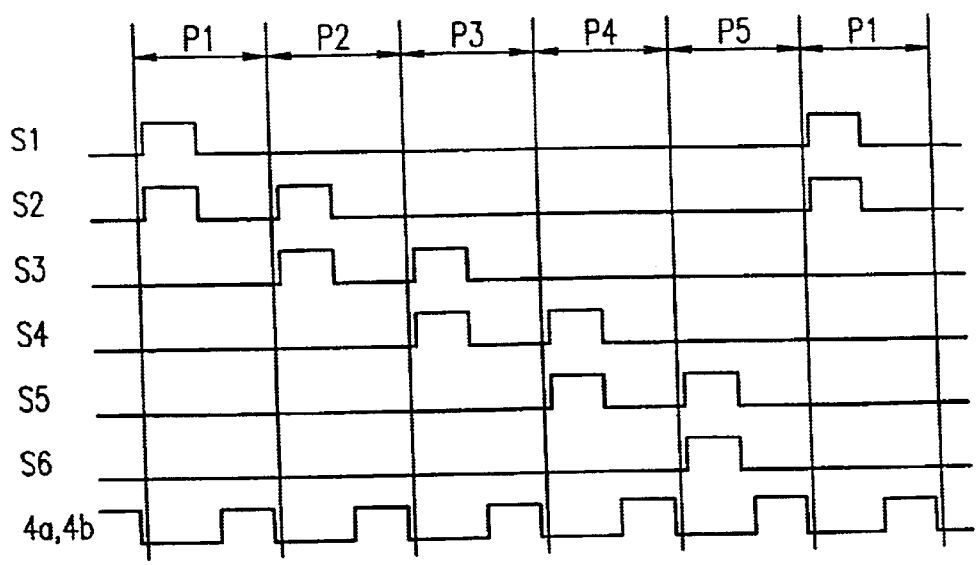
FIG. 4 is a timing chart for illustrating an operation of the conventional multiplex voltage measurement apparatus 300.

In FIG. 1, like elements are indicated by like reference numerals used for the multiplex voltage measurement apparatus 300 of FIG. 3, and detailed descriptions thereof are omitted.

The multiplex voltage measurement apparatus 100 measures each of five serially-connected voltage sources V1–V5.

As shown in FIG. 1, the multiplex voltage measurement apparatus 100 includes: voltage detection terminals T1–T6 connected to the five voltage sources V1–V5; a capacitor 3 having a first terminal 3A and a second terminal 3B; a first sample switch 1 formed by switches S1, S3, and S5 for selectively connecting any of the odd-numbered voltage detection terminals T1, T3, and T5 to the first terminal 3A of the capacitor 3; a second sample switch 2 formed by switches S2, S4, and S6 for selectively connecting any of the even-numbered voltage detection terminals T2, T4, and T6 to the second terminal 3B of the capacitor 3; a voltage measurement circuit 5 for measuring the voltage between the first terminal 3A and the second terminal 3B; a third sample switch 4 formed by switches 4a and 4b for connecting the first terminal 3A and the second terminal 3B of the capacitor 3 to the voltage measurement circuit 5; and a polarity control circuit 6 for controlling opening/closure of the first sample switch 1, the second sample switch 2, and the third sample switch 4.

In the multiplex voltage measurement apparatus 100, the first sample switch 1 and the second sample switch 2 select one of the voltage sources V1–V5 while the third sample switch 4 is open. Then, the first sample switch 1 and the second sample switch 2 are opened, and the third sample switch 4 is then closed. Such a process is repeated, whereby the voltages of the respective voltage sources V1–V5 are measured.

In this example, five voltage sources V1–V5 and six voltage detection terminals T1–T6 are provided, but the number of voltage sources and the number of voltage detection terminals are not limited thereto. The present invention can be practiced so long as N voltage sources and (N+1) voltage detection terminals are provided.

An operation of the multiplex voltage measurement apparatus 100 is now described with reference to FIG. 1. In the case of measuring the voltage of the voltage source V1, the switches S1 and S2 are closed while the third sample switch 4 is open, whereby the capacitor 3 is charged with the voltage of the voltage source V1.

Then, the switches S1 and S2 are opened, and the third sample switch 4 is closed, whereby the voltage of the voltage source V1 is measured by the voltage measurement circuit 5. At this time, the polarity of the first terminal 3A of the capacitor 3 is positive, and the polarity of the second terminal 3B of the capacitor 3 is negative.

In the case of measuring the voltage of the voltage source V2, the switches S2 and S3 are closed while the third sample switch 4 is open, whereby the capacitor 3 is charged with the voltage of the voltage source V2.

Then, the switches S2 and S3 are opened, and the third sample switch 4 is closed, whereby the voltage of the voltage source V2 is measured by the voltage measurement circuit 5. At this time, the polarity of the first terminal 3A of the capacitor 3 is negative, and the polarity of the second terminal 3B of the capacitor 3 is positive.

Thus, the polarity of the capacitor 3 in the case of measuring the voltage source V1 is opposite to that in the case of measuring the voltage source V2.

In the case of measuring the voltage of the voltage source V3, the switches S3 and S4 are closed while the third sample switch 4 is open, whereby the capacitor 3 is charged with the voltage of the voltage source V3. At this time, the polarity of the first terminal 3A of the capacitor 3 is positive, and the polarity of the second terminal 3B of the capacitor 3 is negative, i.e., these polarities are the same as those when the voltage of the voltage source V1 was measured.

Similarly, when the voltage of the voltage source V4 is measured, the polarity of the first terminal 3A of the capacitor 3 is negative, and the polarity of the second terminal 3B of the capacitor 3 is positive. In the case of measuring the voltage of the voltage source V5, the polarity of the first terminal 3A of the capacitor 3 is positive, and the polarity of the second terminal 3B of the capacitor 3 is negative.

Thus, the polarity of the voltage to be applied from the voltage source V1, V3, or V5 to the capacitor 3 is opposite to that of the voltage to be applied from the voltage source V2 or V4 to the capacitor 3.

Now, a case where the voltage sources V1–V5 are repeatedly measured in the order of V1, V2, V3, V4, and V5 will be considered.

When the voltage source V1 is measured after the voltage source V5 has been measured, if one of the switches S1 and S2 is out of order so that it cannot be closed, the capacitor 3 cannot be charged with the voltage of the voltage source V1. That is, the voltage of the voltage source V5 is left in the capacitor 3. Moreover, the polarity of the capacitor 3 when the voltage source V1 is measured is the same as that when the voltage source V5 is measured. Thus, although the electric charge of the capacitor 3 is discharged with the lapse of time and, accordingly, the voltage value of the capacitor 3 varies, the voltage measurement circuit 5 erroneously measures the voltage of the voltage source V5. Therefore, the voltage measurement circuit 5 misreads a voltage value when one of the switches S1 and S2 is out of order so that it cannot be closed. Furthermore, the multiplex voltage measurement apparatus 100 cannot detect such a failure.

Figure 2:
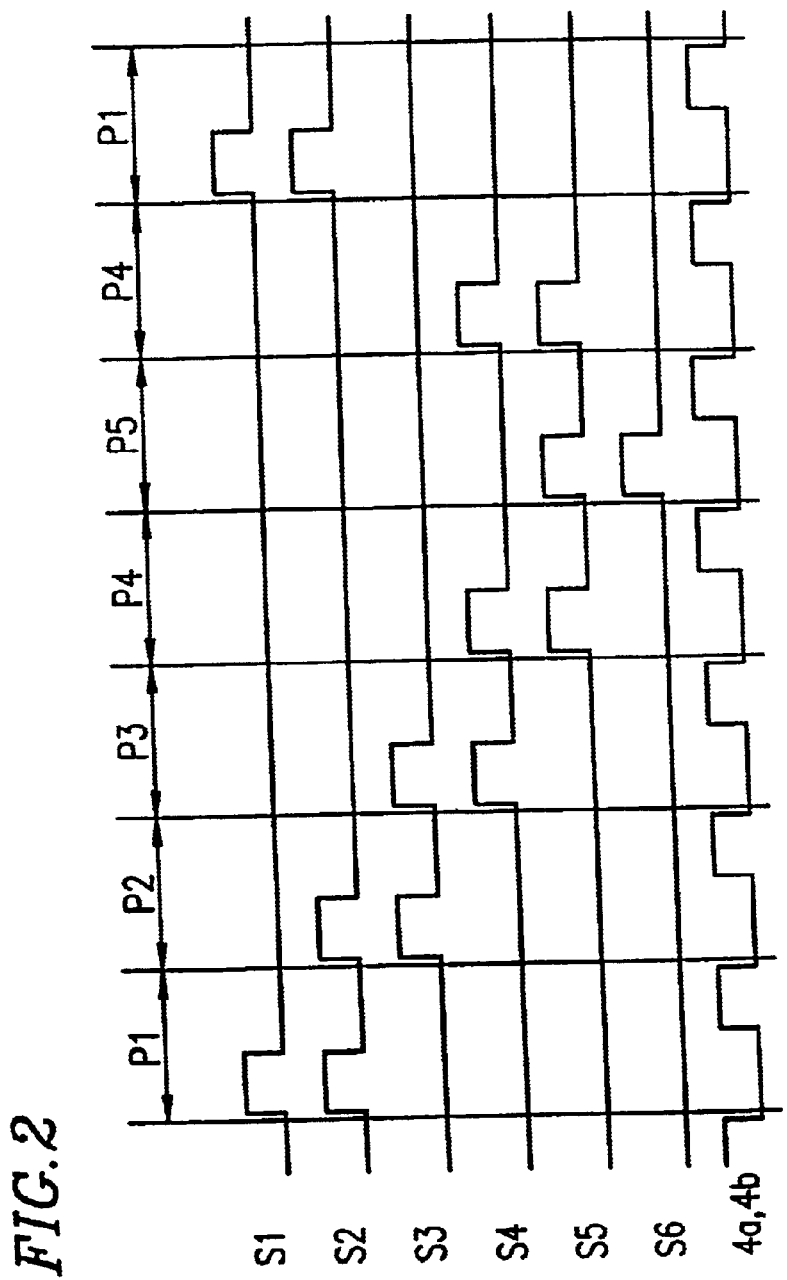
FIG. 2 is a timing chart for illustrating an operation of the multiplex voltage measurement apparatus 100 shown in FIG. 1.

According to the present embodiment of the present invention, as shown in FIG. 2, the operation of the multiplex voltage measurement apparatus 100 is controlled by the polarity control circuit 6 such that the voltage of the voltage source V4 is measured again after the voltage of the voltage source V5 has been measured and before the voltage of the voltage source V1 is measured (V1→V2→V3→V4→V5→V4→V1→V2).

The polarity of the capacitor 3 in the case of measuring the voltage source V4 is opposite to that in the case of measuring the voltage source V1 or V5. Thus, the polarity of the capacitor 3 is inverted at every measurement.

When the voltage of the voltage source V4 is measured after the voltage of the voltage source V5 has been measured, the polarity of the capacitor 3 changes to the opposite polarity. Although the polarity of the measured voltage value for the voltage source V4 is opposite to that for the voltage source V5, a correct voltage value can be obtained by inverting the polarity of the measured voltage value in the voltage measurement circuit 5.

Assume that the voltage measurement circuit 5 obtains the voltage of the voltage source V5 as a positive value and the voltage of the voltage source V4 as a negative value. If the switch S4 or S5 is out of order so that it cannot be closed, the capacitor 3 cannot be charged with the voltage of the voltage source V4, i.e., the voltage of the voltage source V5 remains in the capacitor 3. Therefore, the voltage measurement circuit 5 obtains a positive voltage value. Thus, breakage of the switch S4 or S5 can be detected and, accordingly, an erroneous measurement can be prevented.

This is the same when the voltage of the voltage source V1 is measured after the measurement for the voltage source V4.

As described hereinabove, according to this embodiment of the present invention, the polarity control circuit 6 controls the first sample switch 1, the second sample switch 2, and the third sample switch 4 such that voltages having opposite polarities are alternately stored in the capacitor 3. With such a control arrangement, when the multiplex voltage measurement apparatus 100 obtains voltage values of the same polarity in succession, the multiplex voltage measurement apparatus 100 can determine that there is a broken switch.

Thus, according to the present invention, there is provided a multiplex voltage measurement apparatus which does not measure an erroneous voltage even when one of sample switches is broken so that it cannot be closed.

Furthermore, according to the present invention, there is provided a multiplex voltage measurement apparatus which can detect a failure in an operation of one of the sample switches.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A multiplex voltage measurement apparatus, comprising:

(N+1) voltage detection terminals connected to N serially connected voltage sources;

a capacitor which is charged with a voltage value of any of the N voltage sources;

a first sample switch for selectively connecting odd-numbered voltage detection terminals among the (N+1) voltage detection terminals to a first terminal of the capacitor;

a second sample switch for selectively connecting even-numbered voltage detection terminals among the (N+1) voltage detection terminals of a second terminal of the capacitor;

a voltage measurement circuit for measuring the voltage value stored in the capacitor;

a third sample switch for connecting the first terminal and the second terminal of the capacitor to the voltage measurement circuit; and a polarity controller for controlling the first and second sample switches such that one of the N voltage sources is selected while the third sample switch is open, wherein a failure in the first and second sample switches is detected based on the voltage value measured by the voltage measurement circuit.

2. A multiplex voltage measurement apparatus according to claim 1, wherein the polarity controller allows the first and second sample switches to sequentially select among the N voltage sources in a one-by-one manner such that the capacitor is alternately charged with voltage values having opposite polarities.

* * * * *